United States Patent [19]
Hirota

[11] Patent Number: 5,933,751
[45] Date of Patent: Aug. 3, 1999

[54] METHOD FOR THE HEAT TREATMENT OF II-VI SEMICONDUCTORS

[75] Inventor: Ryu Hirota, Osaka, Japan

[73] Assignee: Sumitomo Electric Industries Ltd., Osaka, Japan

[21] Appl. No.: 09/012,545

[22] Filed: Jan. 23, 1998

[30] Foreign Application Priority Data

Jan. 23, 1997 [JP] Japan ................................ 9-010185
Jan. 13, 1998 [JP] Japan ................................ 10-004857

[51] Int. Cl.$^6$ .................................................. H01L 21/00
[52] U.S. Cl. ............................ 438/558; 438/909; 438/971
[58] Field of Search ................................. 438/510, 558, 438/909, 918, 934, 971, 974

[56] References Cited

U.S. PATENT DOCUMENTS 3,870,473  3/1975  Kyle .
4,960,721  10/1990  Terashima et al. .
5,055,363  10/1991  Tomomura et al. .
5,554,877  9/1996  Kitagawa et al. .

Primary Examiner—Charles Bowers
Assistant Examiner—Keith Christianson
Attorney, Agent, or Firm—Pillsbury Madison & Sutro Intellectual Property Group

[57] ABSTRACT

An object of the invention is to provide a method for the heat treatment of II–VI semiconductors such as ZnS, $ZnS_xSe_{1-x}$, $Zn_yCd_{1-y}Se$, etc. to dope with Group III elements as a donor impurity to reduce its resistivity. This object can be attained by a method for the heat treatment of II–VI semiconductors in a closed vessel, which comprises forming a film of a Group III element as a donor impurity or a Group III element-containing compound on a surface of single crystal of II–VI semiconductors, then charging the single crystal and a Group II element for constituting the single crystal in the closed vessel and heating them in such a manner that the both are not contacted with each other.

14 Claims, 3 Drawing Sheets

METHOD FOR THE HEAT TREATMENT OF II-VI SEMICONDUCTORS

BACKGROUND OF THE INVENTION

1. Field of the Invention

This invention relates to a method for the heat treatment, in particular, annealing of a single crystal of II–VI semiconductors such as ZnS, $ZnS_xSe_{1-x}$, $Zn_yCd_{1-y}Se$, etc. to dope with Group III elements as a donor impurity, and more particularly, it is concerned with a method for annealing a ZnSe bulk single crystal to be used for optoelectronic devices such as blue light-emitting diodes and laser diodes to decrease its resistivity.

2. Description of the Prior Art

As a method of decreasing the resistivity of a ZnSe single crystal, it has been proposed to obtain a low resistivity ZnSe crystal by subjecting the ZnSe single crystal to a heat treatment in molten Zn (J. Phys. D: Appl. Phys., Vol. 9, 1976, pp. 799–810).

However, there arises such a problem that in this heat treatment method, the ZnSe single crystal meets with increase of dislocation density and occurrence of cracks, thus resulting in marked deterioration of crystallinity thereof.

Following up this method, it is found that the dislocation density is increased from an order of $10^4$ cm$^{-2}$ before the heat treatment to $10^6$ cm$^{31\ 2}$ after the heat treatment.

As another method for obtaining a low resistivity ZnSe crystal, it has been proposed to charge a ZnSe single crystal and metallic Zn in an ampoule, followed by sealing, and then heat at a temperature of at least 1000° C. in such a manner that the ZnSe crystal and metallic Zn are not directly contacted (Japanese Patent Laid-Open Publication No. 193700/1991).

When tracing this method, however, there arises such a problem that in the heat treatment as described above without adding a donor impurity, the crystallinity of the ZnSe single crystal is not deteriorated as compared with that before the heat treatment, but a very long time is required for obtaining a necessary low resistivity, and the resistivity, is only lowered to approximately 0.5 to 1 Ωcm with some dispersion of its value.

In the above described method, furthermore, when Zn vapor is condensed and solidified on a surface of ZnSe single crystal, stress occurs in an interface between them due to the difference in thermal-expansion coefficient of Zn and ZnSe single crystal, thus deteriorating the crystallinity of the ZnSe single crystal.

In the above described method, furthermore, the resistivity of the resulting single crystal largely depends on a very small amount of a donor impurity taken in during growth of the compound semiconductor and the amount of the donor impurity cannot be controlled by the heat treatment, so that the resistivity cannot sufficiently be lowered and the resistivity is largely fluctuated.

In the case of rapidly cooling, further, a large temperature gradient is caused in the ZnSe single crystal to deteriorate the crystallinity of the ZnSe single crystal. Even if a Group III element is used as a vapor source, its vapor cannot sufficiently be diffused in the ZnSe single crystal because of the lower vapor pressure and a desired resistivity cannot be obtained.

SUMMARY OF THE INVENTION

It is an object of the present invention to provide a method for the heat treatment of II–VI semiconductors, ZnS, $ZnS_xSe_{1-x}$, $Zn_yCd_{1-y}Se$, etc. to dope with Group III elements as a donor impurity, whereby the above described disadvantages can be overcome and the resistivity can be lowered to a desired value without deterioration of the crystallinity.

It is another object of the present invention to provide a method for the heat treatment, i.e. annealing of a semiconductor of Group II–VI element compounds such as ZnS, $ZnS_xSe_{1-x}$, $Zn_yCd_{1-y}Se$, etc., to dope it with Group III elements as a donor impurity to reduce the resistivity thereof.

These objects can be attained by a method for heat-treating or annealing II–VI semiconductors in a closed vessel, which comprises forming a film of a Group III element as a donor impurity or a Group III element-containing compound on a surface of single crystal of II–VI semiconductors, then charging the single crystal and a Group II element for constituting the single crystal in the closed vessel and heating them in such a manner that the both are not contacted with each other.

BRIEF DESCRIPTION OF THE DRAWINGS

The accompanying drawings illustrate the principle and merits of the present invention in detail.

DETAILED DESCRIPTION OF THE INVENTION

Figure 1:
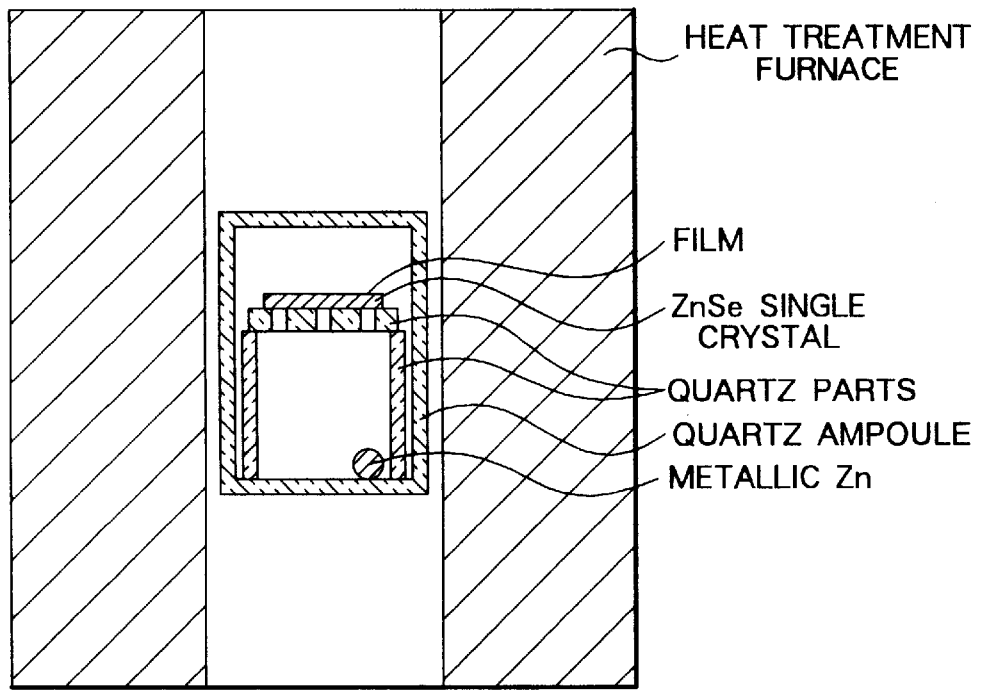
FIG. 1 is a schematic view of an apparatus for the practice of a method for the heat treatment according to the present invention, in which a film of a Group III element as a donor impurity or a Group III element-containing compound is formed on a surface of ZnSe single crystal, enclosed in a quartz ampoule with metallic Zn and then heat treated.

The inventor has made various efforts to develop a method for the heat teatment of a single crystal of II–VI semiconductors such as ZnS, $ZnS_xSe_{1-x}$, $Zn_yCd_{1-y}Se$, etc., with Group III elements as a donor impurity, whereby the resistivity of II–VI semiconductors can be decreased to a desired value without occurrence of precipitates in the crystal and deterioration of the crystallinity, and consequently has found that the following constructions are effective for this purpose.

(1) A method for the heat treatment of II–VI semiconductors in a closed vessel, which comprises forming a film of a Group III element as a donor impurity or a Group III element-containing compound on a surface of single crystal of II–VI semiconductors, then charging the single crystal and a Group II element for constituting the single crystal in the closed vessel and heating them in such a manner that the both are not contacted with each other.

(2) A method for the heat treatment of ZnSe single crystal to dope it with a Group III element to decrease the resistivity in a closed vessel, which comprises forming a film of a Group III element as a donor impurity or a Group III element-containing compound on a surface of ZnSe single crystal, then charging the single crystal and Zn in the closed vessel and heating them in such a manner that the both are not contacted with each other.

(3) The method for the heat treatment as described in the above described (1) or (2), wherein a film of a Group III element or a Group III element-containing compound is formed on a surface of single crystal of II–VI semiconductors, then a film consisting of any one of Group II element for constituting the single crystal, Group VI element for constituting the single crystal or II–VI semiconductors is formed and then heated.

(4) The method for the heat treatment as described in the above described (1) or (2), wherein a film of a Group III element or a Group III element-containing compound is formed on a surface of single crystal of II–VI semiconductors, a separately prepared film of a II–VI semiconductor is closely contacted thereon and heated.

(5) The method for the heat treatment as described in the above described (1) or (2), wherein a film of a Group III element or a Group III element-containing compound is formed on a surface of single crystal of II–VI semiconductors, a separately prepared single crystal of a II–VI semiconductor is closely contacted thereon and heated.

(6) The method for the heat treatment as described in the above described (1) or (2), wherein a film of a Group III element or a Group III element-containing compound is formed respectively on surfaces of two single crystals of II–VI semiconductors, the films are closely contacted with each other and heated.

(7) The method for the heat treatment as described in the above described (1) or (2), wherein a film of a Group III element or a Group III element-containing compound is formed on a surface of single crystal of II–VI semiconductors, a flat plate of a material not reactive with Group III element is closely contacted thereon and heated.

(8) The method for the heat treatment as described in any one of the above described (4) to (7), wherein the surface of the single crystal of II–VI semiconductors, on which a film of a Group III element or a Group III element-containing compound is formed, is in such a state that a difference in height between concave areas and convex areas of the surface is at most 5000 Å, preferably 0 to 1000 Å on an average in the plane.

(9) The method for the heat treatment as described in any one of the above described (1) to (8), wherein a Group III element as a donor impurity is enclosed in the closed vessel and heated.

(10) The method for the heat treatment as described in any one of the above described (1) to (9), wherein a film thickness of a Group III element or a Group III element-containing compound is in a range of 100 to 3000 Å, preferably 250 to 1500 Å.

(11) The method for the heat treatment as described in any one of the above described (1) to (10), wherein a ratio of a weight of the Group II element enclosed in the closed vessel to an inner volume of the closed vessel is at least 0.001 g/cm$^3$ and the weight of the Group II element is at most 10 g.

(12) The method for the heat treatment as described in any one of the above described (1) to (11), wherein the part of II–VI semiconductor single crystal in the closed vessel is heated at a temperature of 700 to 1200° C., preferably 900 to 1170° C. and the lowest temperature part is heated at a temperature of 700 to 1200° C., preferably 900 to 1150° C.

(13) The method for the heat treatment as described in any one of the above described (1) to (12), wherein at the end of the heat treatment, the II–VI semiconductor is cooled at a cooling rate of 10 to 200° C./min, preferably 20 to 200° C./min.

(14) The method for the heat treatment as described in any one of the above described (1) to (13), wherein during the cooling step at the end of the heat treatment, the cooling is carried out in such a structure that a part for holding air-tightness of the closed vessel does not show the lowest temperature.

PREFERRED EMBODIMENT OF INVENTION

In the present invention, a film of a Group III element as a donor impurity or a Group III element-containing compound is formed on a surface of single crystal of II–VI semiconductors, the single crystal and a Group II element for constituting the single crystal are charged in a closed vessel and subjected to a heat treatment in such a manner that the both are not brought into contact with each other. Thus, the resistivity of the single crystal of the II–VI semiconductors can readily be controlled without deterioration of the crystallinity.

The single crystal of the II–VI semiconductors, to be treated by the method for the heat treatment according to the present invention, includes ZnS, $ZnS_xSe_{1-x}$, $Zn_yCd_{1-y}Se$, etc. The above described donor impurities, Group III elements are exemplified by Al, B, Ga, In, etc. The Group III element-containing compounds are, for example, $Al_2O_3$, $B_2O_3$, $Ga_2O_3$, $In_2O_3$, etc.

For example, as to the single crystal of the II–VI semiconductors, the ZnSe single crystal to be used for optoelectronic devices such as blue light-emitting diodes, laser diodes, etc. will now be illustrated in the following.

As well known in the art, Zn vacancies in ZnSe single crystal act as an acceptor and for the purpose of decreasing the resistivity thereof, it is required to decrease the Zn vacancies and acceptor concentration by diffusing Zn by annealing so that n-type carriers formed by diffusion of the donor impurities will not be decreased.

In the present invention, a film containing a Group III element such as Al, etc. is previously formed on a surface of ZnSe single crystal before a heat treatment, i.e. annealing. Thereby, the thickness of the film containing a Group III element is controlled so that deterioration of the crystallinity thereof, for example, increase of the dislocation density may not be caused, and a quantity of diffusion required for obtaining a desired resistivity can be controlled by such a film thickness.

Furthermore, the ZnSe single crystal is heat treated in a vapor of Group II element, e.g. Zn vapor and Zn is diffused through the ZnSe single crystal to decrease Zn vacancies. Consequently, of diffused Group III elements such as Al, a proportion of activated ones is increased, whereby n-type carriers are increased and a desired resistivity can be obtained. During the same time, the ZnSe single crystal is arranged in a closed reaction vessel or reaction tube, e.g. a quartz ampoule, so that Zn is not contacted with the surface of ZnSe single crystal and the ZnSe single crystal after the heat treatment is protected from adhesion of Zn to the surface thereof. As a result, deterioration of the crystallinity of the ZnSe single crystal, for example, occurrence of cracks can be suppressed. In comparison with the heat treatment in a melt, use of a smaller amount of a metal is sufficient so that cracking of the quartz ampoule can readily be prevented and a desired resistivity can be obtained with good reproducibility.

FIG. 1 shows one embodiment of a heat treatment apparatus for carrying out the above described method, in which a ZnSe single crystal, on the surface of which a film containing a Group III element has previously been formed, is placed on a perforated plate-shaped quartz part and charged in a quartz ampoule, on the bottom of which metallic Zn is placed, the ampoule is closed and then charged in a furnace, followed by subjecting it to a heat treatment at a predetermined temperature.

In the present invention, a film of a Group III element or Group III element-containing compound is formed on a surface of ZnSe single crystal and then a film consisting of any one of Zn, Se or ZnSe is formed thereon. Accordingly, oxidation of the film of the Group III element or Group III element-containing compound during exposure to the air can be prevented and a quantity of the Group III element effectively diffused in the ZnSe single crystal can be controlled in more precise manner. In the case of forming a film consisting of any one of Zn, Se or ZnSe, in particular, the Group III element is prevented from dissipation during the heat treatment. Such a film is ordinarily formed in a thickness of 0.05 to 5 $\mu$m by vacuum evaporation.

In the case of not forming the film of any one of Zn, Se or ZnSe, on the other hand, the Group III element evaporates from the film formed on the surface of the ZnSe single crystal during the heat treatment and condensed on the lowest temperature part of the closed vessel or reacted with the quartz for constituting the vessel, so the quantity of the Group III element on the surface of the ZnSe single crystal is decreased and it becomes harder to precisely control of the diffusion quantity through the ZnSe single crystal.

According to the present invention, the dissipation of the Group III element from the film during the heat treatment can largely be prevented by bringing a separately prepared ZnSe film into close contact with the film and subjecting to a heat treatment. Consequently, the Group III element can effectively be diffused in the ZnSe single crystal, the diffusion quantity thereof can readily be controlled and the resistivity of the resulting ZnSe single crystal can precisely be controlled. Since the film thickness required for a desired resistivity can be decreased, deterioration of the crystallinity, for example, increase of a dislocation density after the heat treatment can markedly be suppressed.

In the present invention, furthermore, instead of the above described separately prepared ZnSe film, a ZnSe single crystal or a ZnSe single crystal, on the surface of which a film containing a Group III element has previously been formed, is brought into close contact with the film and subjected to a heat treatment. In particular, in the latter case, this is carried out after tightly contacting the films each containing the Group III element with each other. Thus, dissipation of the Group III element from the above described film during the heat treatment can be prevented and the two ZnSe single crystals holding the films each containing the Group III element therebetween can simultaneously be doped with the Group III elements and heat treated. Furthermore, three or more ZnSe single crystal films can be stacked and then subjected to a heat treatment.

Figure 2:
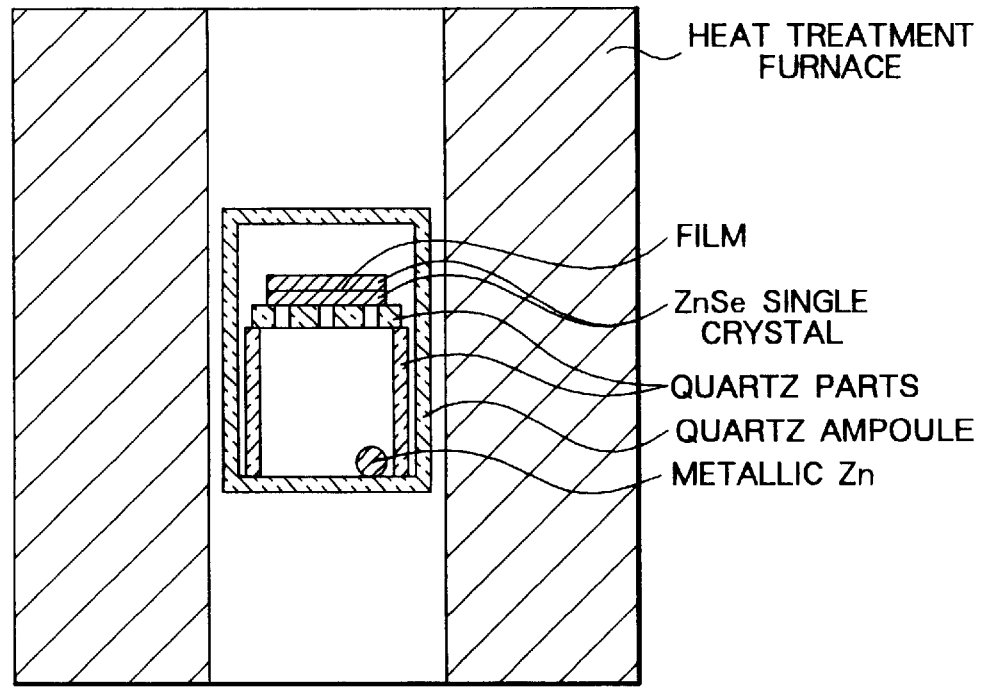
FIG. 2 is a schematic view of an apparatus for the heat treatment, in which a ZnSe single crystal is closely contacted with a film of a Group III element or a Group III element-containing compound on a surface of ZnSe single crystal and heat treated in the apparatus shown in FIG. 1.

FIG. 2 shows another embodiment of a heat treatment apparatus for carrying out the above described method, in which a film containing a Group III element is previously formed on a surface of a ZnSe single crystal, while, separately, another ZnSe single crystal having a film containing a Group III element is prepared, and they are mounted on a quartz part while closely contacting the films each containing the Group III element with each other and charged in a quartz ampoule, on the bottom of which metallic Zn is placed, followed by closing the ampoule, charging it in a furnace and subjecting it to a heat treatment at a predetermined temperature.

As another method for preventing dissipation of a Group III element from the foregoing film during the heat treatment, there is a method of carrying out a heat treatment, while closely contacting a flat plate of a material not reactive with Group III elements with the foregoing film.

Figure 3:
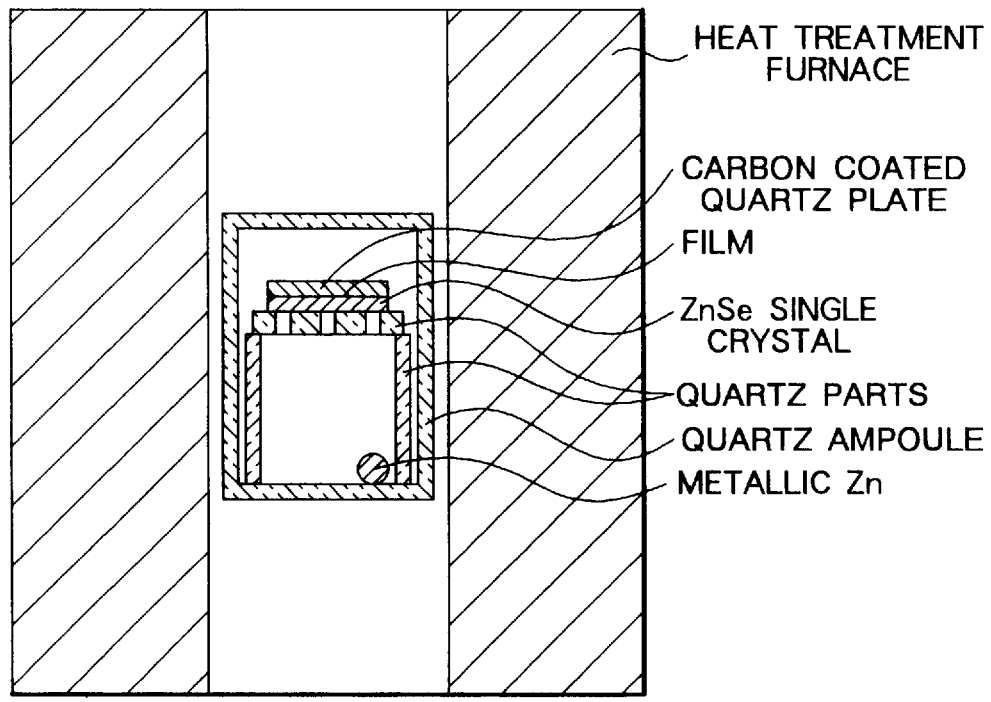
FIG. 3 is a schematic view of an apparatus for the heat treatment, in which a carbon coated quartz flat plate is closely contacted with a film of a Group III element or a Group III element-containing compound on a surface of ZnSe single crystal and heat treated in the apparatus shown in FIG. 1.

FIG. 3 shows a further embodiment of a heat treatment apparatus for carrying out the above described method, in which a carbon-coated quartz plate is closely contacted therewith in place of the ZnSe single crystal of FIG. 2, placed in a quartz ampoule in the similar manner to FIG. 2, on the bottom of which metallic Zn is placed, the ampoule is closed and then charged in a furnace, followed by subjecting it to a heat treatment at a predetermined temperature.

As a ZnSe single crystal to be coated with a Group III element-containing film, there is used one having a surface with a height difference of at most 5000 Å on an average in the plane between convex areas and concave areas of the surface whereby to assure flatness of the Group III element-containing film and improve adhesiveness of the ZnSe film, ZnSe single crystal, ZnSe single crystal, on the surface of which a film containing a Group III element has previously been formed or the above described inert quartz plate when this is brought into contact with the film. Consequently, deterioration of the crystallinity, for example, increase of dislocation density after the heat treatment can be suppressed, since dissipation of the Group III element from the above described film can be rendered less and the film thickness of the Group III element-containing film, required for obtaining a desired resistivity, can be decreased.

As another method for preventing the above described film from dissipation of the Group III element during the heat treatment, the Group III element to be a donor impurity is charged in a quartz ampoule and evaporation of the Group III element from the Group III element-containing film on the surface of ZnSe single crystal during the heat treatment is suppressed, so that the resistivity of the resulting ZnSe single crystal may more correctly be controlled.

Figure 4:
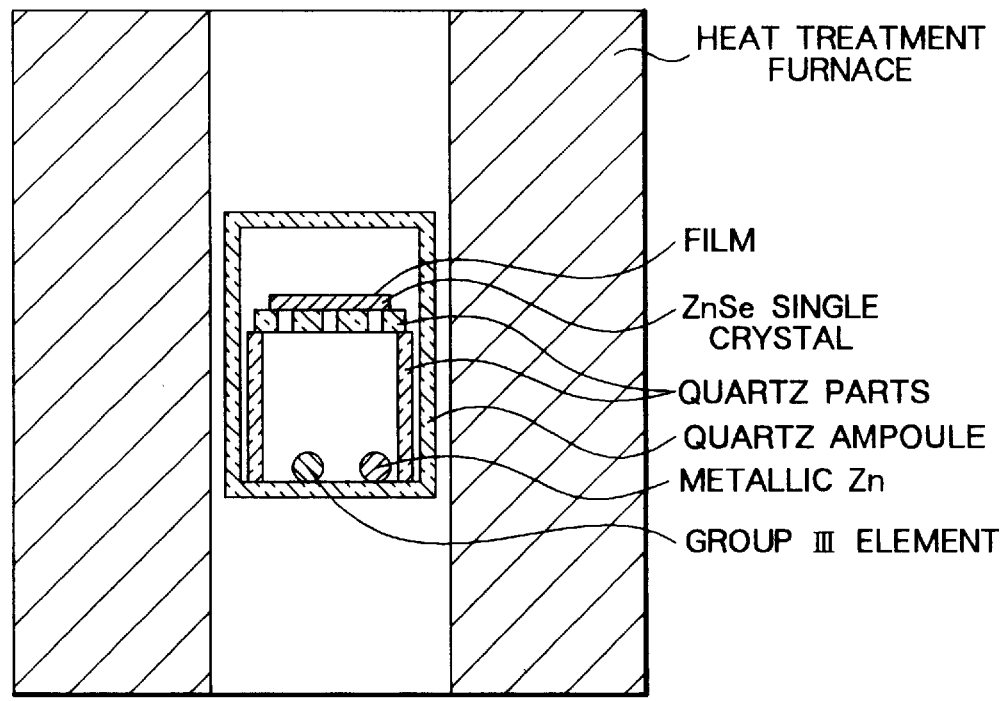
FIG. 4 is a schematic view of an apparatus for the heat treatment, in which a Group III element is enclosed with metallic Zn and heat treated in the apparatus shown in FIG. 1.

FIG. 4 shows a still further embodiment of a heat treatment apparatus for carrying out the above described method, in which a Group III element is added at the bottom of the apparatus of FIG. 1, the ampoule is closed and then charged in a furnace, followed by subjecting it to a heat treatment at a predetermined temperature.

The thickness of a film of a Group III element or Group III element-containing compound formed on the surface of ZnSe single crystal is suitably adjusted to a range of 100 to 3000 Å. If the film thickness is less than 100 Å, an oxidation quantity of the Group III element in the film is in a larger proportion for the whole quantity of the film, resulting in dispersion in a quantity of the Group III element diffused through the ZnSe single crystal, when the ZnSe single crystal is taken out of a vaporization apparatus in the air.

During the heat treatment, the Group III element is evaporated from the surface of the ZnSe single crystal and condensed on a lowest temperature part of the quartz ampoule or reacted with quartz of the ampoule. As the heat treatment time is the longer, the quantity of the Group III element on the surface of the ZnSe single crystal is the less, causing dispersion of the quantity of the Group III element diffused in the ZnSe single crystal.

On the other hand, when the film thickness is larger than 3000 Å, stress occurs at a boundary between the film and ZnSe single crystal due to the difference in thermal-expansion coefficient between the ZnSe single crystal and film during the heat treatment and the diffusion quantity of a Group III element is larger required thereby causing crystallinity to be deteriorated.

The weight of a Group II element, for example, Zn to be enclosed in the quartz ampoule is preferably so controlled as to be at least 0.001 g/cm$^3$ for the inner volume of the ampoule and at most 10 g. In order to reduce Zn vacancies in the ZnSe single crystal, it is desirable to produce a maximum Zn vapor pressure at the heat treatment temperature in the quartz ampoule during the heat treatment. For example, the weight of Zn for producing the saturated vapor pressure of Zn at 1000° C. is about $1.4 \times 10^{-9}$ g/cm$^3$ and in practice, at least 0.001 g/cm$^3$ is required since the surface of Zn is exposed to the air and oxidized. Moreover, it is necessary to suppress the weight of Zn to at most 10 g so as to prevent the ampoule during cooling from cracking.

The temperature at the ZnSe part in the quartz ampoule during the heat treatment is preferably 700 to 1200° C. and at the lowest temperature part is preferably 700 to 1200° C., since quartz softens at 1200° C. and the heat treatment must be carried out at a whole ampoule temperature of at most 1200° C. ZnSe having a phase transition temperature of 1425° C. is considered to be considerably soft at 1200° C. Therefore, the ZnSe part must be heated at a temperature of at most 1200° C. so as to prevent the single crystal from deterioration of the crystallinity due to self weight.

When the heat treatment is carried out in a Zn atmosphere in a quartz ampoule and the temperature at the lowest temperature part for defining the vapor pressure of Zn during the heat treatment exceeds 1200° C., there is a danger of bursting of the ampoule by the vapor pressure of Zn. Accordingly, it is necessary to adjust the temperature of the lowest temperature part to at most 1200° C. When the temperature of the quartz ampoule is lower than 700° C., Zn and Group III elements such as Al, etc. cannot sufficiently be diffused through the ZnSe single crystal in a practical heat treatment time and its resistivity cannot sufficiently be reduced.

The cooling rate at the end of the heat treatment is preferably 10 to 200° C./min. According to the heat treatment in Zn atmosphere, Zn vacancies are decreased at a high temperature and increased at a low temperature. When the Zn vacancies are decreased, the acceptor density is decreased and thus, rapid cooling while maintaining this state is more useful for decreasing the resistivity. However, such a rapid cooling tends to increase thermal strain in a single crystal and accordingly, it is preferable to effect the cooling at such a rate that the crystallinity of the single crystal is not deteriorated, i.e. at the above described range of cooling rate.

Moreover, it is desirable to employ such a structure that a part for maintaining air-tightness of the closed vessel does not show the lowest temperature in the closed vessel during the step of cooling. When using a quartz ampoule, carbon coating is taken into consideration for the purpose of reducing stress occurring at a boundary between Zn and quartz, but it is desired that the part for maintaining air-tightness is prevented from solidification of Zn and the air-tightness is not broken by the stress due to difference in thermal-expansion coefficient between Zn and quartz, by employing the above described structure. For example, the part for maintaining air-tightness is preferably prevented from solidification of Zn vapor by providing a quartz plate at the bottom to be the lowest temperature or by doubling a sealing part. According to this method, air-tightness is more effectively maintained as compared with the carbon coating method, resulting in the possibility of simplification of the process.

Figure 5:
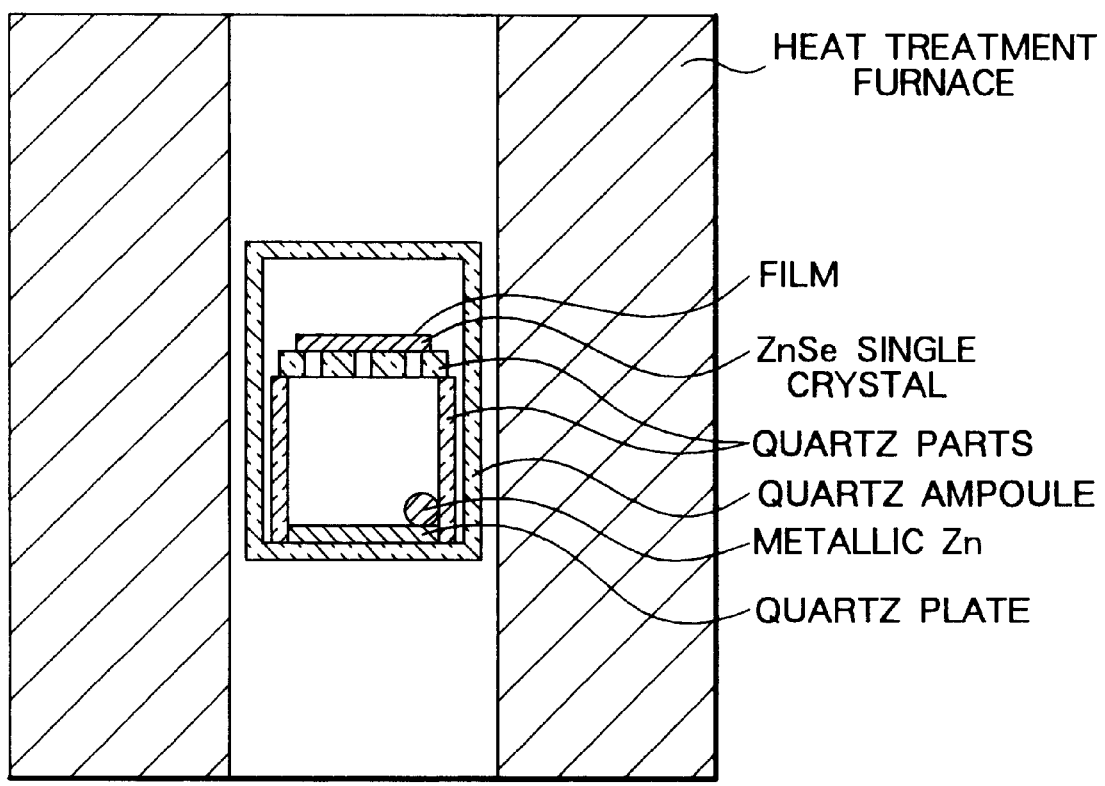
FIG. 5 is a schematic view of an apparatus for the heat treatment, in which a quartz plate is arranged in the bottom of a quartz ampoule, metallic Zn is placed thereon and heat treated in the apparatus shown in FIG. 1.

FIG. 5 shows a still further embodiment of an apparatus for the heat treatment, in which in the above described method, a quartz plate is arranged on the bottom part becoming the lowest temperature during cooling at the fastest rate in the closed vessel.

The following Examples are given in order to illustrate the invention in detail without limiting the same.

EXAMPLE 1

ZnSe single crystal was cut by a slicer in parallel with its (100) plane to obtain a plate-shaped crystal of 10 mm square and 1 mm thick. The resistivity of this plate-shaped crystal exceeded the upper limit of the measurable range by the Hall measurements, i.e. $10^5$ Ωcm so high that this measurement method cannot be applied. The dislocation density was measured by polishing the surface of the crystal to give a mirror surface, etching with a brominemethanol solution and estimating the etch pit density (EPD). The dislocation density before heat treatment was 50,000 cm$^{-2}$. The surface to be vacuum evaporated was not subjected to the mirror polishing and roughness present over the whole surface was measured by a stylus type surface roughness meter to obtain a difference in height between concave areas and convex areas of 8500 Å on an average in the plane.

The crystal surface was adequately cleaned and then subjected to vacuum evaporation to coat the whole surface with Al of 1000 Å in thickness in a vacuum chamber of $1 \times 10^{-6}$ Torr. This plate-shaped crystal and 0.1 g of Zn were enclosed in a quartz ampoule having an inner volume of 15 cm$^3$ and sealed when the pressure reached $2 \times 10^{-8}$ Torr. Then, this ampoule was charged in a furnace adjusted to a uniform temperature profile and heated. The heat treatment was carried out at a temperature of 950° C. for seven days and then cooled to room temperature at a cooling rate of 10° C./min.

After the heat treatment, vacuum evaporated Al was diffused in the interior part of the crystal or released from the crystal surface during the heat treatment and decreased to such a level that cannot visually be confirmed. Consequently, stress occurring on the crystal surface was remarkably decreased as compared with a case where the heat treatment was carried out in the melt as in the prior art.

When the crystal was mirror polished from both the surfaces respectively by 100 μm and the surfaces thereof were observed, no cracks occurred. The resistivity of the ZnSe single crystal after the heat treatment (Hall measurements) was 0.05 Ωcm and as a result of observing EPD, it was found that the dislocation density was $10^5$ cm$^{-2}$.

EXAMPLE 2

When a heat treatment was carried out in an analogous manner to Example 1 except changing only the film thickness of vacuum evaporated Al, the resistivity was 0.08 Ωcm and the dislocation density was $5 \times 10^4$ cm$^{-2}$ at a vacuum evaporated film thickness of 100 Å, i.e. the dislocation density was not increased as compared with before the heat treatment. On the other hand, when the vacuum evaporated film thickness was adjusted to 3000 Å, the resistivity was 0.02 Ωcm and the dislocation density was $10^5$ cm$^{-2}$ same as that of Example 1, which was increased more than before the heat treatment.

For comparison, when the vacuum evaporated film thickness was adjusted to 5000 Å, the resistivity was decreased to 0.02 Ωcm, but the dislocation density was increased to $10^5$ cm$^{-2}$, thus resulting in marked deterioration of the crystallinity. When the vacuum evaporated film thickness was adjusted to 50 Å, the resistivity was 0.2 Ωcm, and the dislocation density was $5 \times 10^4$ cm$^{-2}$, in which there was found no deterioration of the crystallinity, but the resistivity was not sufficiently reduced.

EXAMPLE 3

When three experiments were carried out in an analogous manner to Example 1 except vacuum evaporating Zn, Se and ZnSe respectively in a thickness of 1000 Å after vapor evaporation of Al on a surface of ZnSe single crystal in Example 1, the resistivity was 0.03 Ωcm, better than Example 1, in each experiment and the dislocation density was changed from $5 \times 10^4$ cm$^{-2}$ before the heat treatment to $10^5$ cm$^{-2}$, similar to Example 1.

EXAMPLE 4

When an experiment was carried out in an analogous manner to Example 1, except changing the weight of Zn charged in the quartz ampoule to 0.0005 g/cm$^3$, the resistivity was 0.2 Ωcm and air-tightness was not broken, but the resistivity of the ZnSe single crystal was not sufficiently decreased.

When the weight of Zn was 0.005 g/cm$^3$, the resistivity was 0.05 Ωcm and air-tightness was not broken.

When the similar procedure was repeated except changing the weight of Zn in 10 g, the resistivity was 0.05 Ωcm and air-tightness was not broken. The dislocation density was increased, in each case, from $5 \times 10^4$ cm$^{-2}$ before the heat treatment to $10^5$ cm$^{-2}$, similar to Example 1.

When the similar procedure was repeated except changing the weight of Zn in 20 g, for comparison, cracks occurred in the quartz ampoule and air-tightness was broken. The resistivity was 0.3 Ωcm and the resistivity of the ZnSe single crystal was not sufficiently decreased, because air-tightness was broken during the cooling step and the ZnSe single crystal was not under sufficient Zn vapor pressure in spite of the high temperature, resulting in increase of the density of Zn vacancies and acceptor density in the ZnSe single crystal.

EXAMPLE 5

When an experiment was carried out in an analogous manner to Example 1 except charging 0.3 g of Al in the closed vessel, the resistivity was 0.03 Ωcm, being smaller than that of Example 1. The dislocation density was increased to $10^5$ cm$^{-2}$, similar to Example 1.

EXAMPLE 6

When an experiment was carried out in an analogous manner to Example 1 except changing the heat treatment temperature from 950° C. of Example 1 to 700° C., there was obtained a good crystal having a resistivity of 0.08 Ωcm and a dislocation density of $10^5$ cm$^{-2}$.

For comparison, when the heat treatment temperature was adjusted to 650° C., the resistivity was 0.6 Ωcm and the dislocation density was $10^5$ cm$^{-2}$. The increase of the dislocation density was similar to Example 1, but the resistivity was not sufficiently decreased.

When an experiment was carried out in an analogous manner to Example 1 except changing the heat treatment temperature from the uniform temperature profile to a non-uniform temperature profile such that the ZnSe part was at 1300° C. and the lowest temperature part was at 1000° C., deterioration of the crystallinity took place as represented by a resistivity of 0.05 Ωcm and a dislocation density of $10^6$ cm$^{-2}$.

EXAMPLE 7

When an experiment was carried out in an analogous manner to Example 1 except changing the cooling rate at the end of the heat treatment from 10° C./min of Example 1 to 1° C./min, 60° C./min, 200° C./min and 300° C./min, the resistivities were, in order, 0.1 Ωcm, 0.04 Ωcm, 0.03 Ωcm and 0.03 Ωcm. Namely, there were obtained crystals each having sufficently low resistivity exclusive of the case of 1° C./min. The dislocation densities were, in order, not increased, increased to $10^5$ cm$^{-2}$, increased to $10^5$ cm$^{-2}$ and increased to $8 \times 10^5$ cm$^{-2}$. In the case of 60° C./min and 200° C./min, there were obtained similar results to Example 1, but in the case of 300° C./min, the dislocation density was largely increased and cracks occurred.

EXAMPLE 8

When an experiment was carried out in an analogous manner to Example 1 except that a quartz plate was arranged, during cooling, on the bottom plate at the lowest temperature in the quartz ampoule and Zn was placed thereon, Zn was solidified on the quartz plate, cracks occurred on a flat plate, Zn did not adhere to the quartz ampoule and air-tightness of the ampoule was maintained.

For comparison, when the procedure of Example 1 was repeated ten times under the same conditions, air-tightness of the ampoule was not broken, but fine cracks occurred, twice during the ten times, on a part where Zn was solidified and there was a fear of breakage of air-tightness in the ampoule.

EXAMPLE 9

An experiment was carried out in an analogous manner to Example 1 except that the dislocation density before the heat treatment was $5 \times 10^4$ cm$^{-2}$, the height difference of concave areas and convex areas was adjusted to 8500 Å on an average in the plane, two ZnSe single crystals of 1 mm in thickness were prepared, the thickness of Al vacuum evaporated films formed on the ZnSe single crystal was changed and the two ZnSe single crystals were closely contacted with each other in such a manner that the Al films were faced each other. Consequently, properties of the two ZnSe single crystals were completely same and when the Al film thickness was 100 Å, the resistivity was 0.06 Ωcm and the dislocation density was $5 \times 10^4$ cm$^{-2}$, which was not changed from before the heat treatment. When the Al film thickness was 500 Å, the resistivity was 0.04 Ωcm and the dislocation density was not increased. Further, when the Al film thickness was 1000 Å, the resistivity was 0.03 Ωcm and the dislocation density was increased to $10^5$ cm$^{-2}$, similar to Example 1.

EXAMPLE 10

An experiment was carried out in an analogous manner to Example 1 except vacuum evaporating Al on the surface of the ZnSe single crystal in a thickness of 500 Å and then closely contacting a carbon coated quartz plate with the Al evaporated surface. Consequently, the resistivity was 0.04 Ωcm and the dislocation density was not increased. Further, when the Al film thickness was 500 Å, the resistivity was 0.04 Ωcm and the dislocation density was $5 \times 10^4$ cm$^{-2}$, same as before the heat treatment and not increased.

EXAMPLE 11

An experiment was carried out in an analogous manner to Example 9 except that the flatness of the Al vacuum evaporated surface obtained by cutting the ZnSe single crystal by means of a slicer and then polishing was adjusted to a height difference of concave areas and convex areas on an average in the plane, as measured by the measurement method of Example 1, in a quantity of 5000 Å and the Al vacuum evaporated film thickness was adjusted to 500 Å. Consequently, the resistivity was 0.03 Ωcm, same as when the Al vacuum evaporated film thickness was 1000 Å in Example 9. The dislocation density was $5 \times 10^4$ cm$^{-2}$, same as before the heat treatment and not increased. This result was better than that of Example 9.

ADVANTAGES OF THE INVENTION

Use of the above described construction according to the present invention results in that the resistivity of II–VI semiconductors can be lowered to a desired value without occurrence of precipitates in the crystal and without deterioration of the crystal quality.

What is claimed is:

1. A method for the heat treatment of II–VI semiconductors in a closed vessel, which comprises forming a film of a Group III element as a donor impurity or a Group III element-containing compound on a surface of single crystal of II–VI semiconductors, then charging the single crystal and a Group II element for constituting the single crystal in the closed vessel and heating them in such a manner that the both are not contacted with each other.

2. A method for the heat treatment of ZnSe single crystal to dope it with a Group III element to decrease the resistivity in a closed vessel, which comprises forming a film of a Group III element as a donor impurity or a Group III element-containing compound on a surface of ZnSe single crystal, then charging the single crystal and Zn in the closed vessel and heating them in such a manner that the both are not contacted with each other.

3. The method for the heat treatment as claimed in claim 1 or claim 2, wherein a film of a Group III element or a Group III element-containing compound is formed on a surface of single crystal of II–VI semiconductors, then a film consisting of any one of Group II element for constituting the single crystal, Group VI element for constituting the single crystal or II–VI semiconductors is formed thereon and then heated.

4. The method for the heat treatment as claimed in claim 1 or claim 2, wherein a film of a Group III element or a Group III element-containing compound is formed on a surface of single crystal of II–VI semiconductors, a separately prepared film of a II–VI semiconductor is closely contacted thereon and heated.

5. The method for the heat treatment as claimed in claim 1 or claim 2, wherein a film of a Group III element or a Group III element-containing compound is formed on a surface of single crystal of II–VI semiconductors, a separately prepared single crystal of a II–VI semiconductor is closely contacted thereon and heated.

6. The method for the heat treatment as claimed in claim 1 or claim 2, wherein a film of a Group III element or a Group III element-containing compound is formed respectively on surfaces of two single crystals of II–VI semiconductors, the films are closely contacted with each other and heated.

7. The method for the heat treatment as claimed in claim 1 or claim 2, wherein a film of a Group III element or a Group III element-containing compound is formed on a surface of single crystal of II–VI semiconductors, a flat plate of a material not reactive with Group III element is closely contacted thereon and heated.

8. The method for the heat treatment as claimed in claim 1 or 2, wherein a film thickness of a Group III element or a Group III element-containing compound is in a range of 100 to 3000 Å.

9. The method for the heat treatment as claimed in claim 1 or 2, wherein a ratio of a weight of the Group II element enclosed in the closed vessel to an inner volume of the closed vessel is at least 0.001 g/cm$^3$ and the weight of the Group II element is at most 10 g.

10. The method for the heat treatment as claimed in claim 1 or 2, wherein a part of II–VI semiconductor single crystal in the closed vessel is heated at a temperature of 700 to 1200° C. and the lowest temperature part in the closed vessel is heated at a temperature of 700 to 1200° C.

11. The method for the heat treatment as claimed in claim 1 or 2, wherein at the end of the heat treatment, the II–VI semiconductor is cooled at a cooling rate of 10 to 200° C./min.

12. The method for the heat treatment as claimed in claim 1 or 2, wherein during the cooling step at the end of the heat treatment, the cooling is carried out in such a structure that a part for holding air-tightness of the closed vessel does not show the lowest temperature.

13. The method for the heat treatment as claimed in claim 1 or claim 2, wherein when dissipation of Group III element is prevented from the film of a Group III element or Group III element-containing compound, the surface of the single crystal of II–VI semiconductors, on which a film of a Group III element or a Group III element-containing compound is formed, is in such a state that a difference in height between concave areas and convex areas of the surface is at most 5000 Å on an average in the plane.

14. The method for heat treatment as claimed in claim 1 or claim 2, wherein a mass of Group III element as a donor impurity is enclosed in the closed vessel without contacting with the II–VI semiconductors and subjected to the heat treatment.

* * * * *